(12) United States Patent
Shen et al.

(10) Patent No.: US 11,402,132 B2
(45) Date of Patent: Aug. 2, 2022

(54) SOLAR ENERGY CONVERTER AND RELATED METHODS

(71) Applicant: Carnegie Mellon University, Pittsburgh, PA (US)

(72) Inventors: Sheng Shen, Pittsburgh, PA (US); Pengfei Li, Shen Zhen (CN); Baoan Liu, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 41 days.

(21) Appl. No.: 17/012,444

(22) Filed: Sep. 4, 2020

(65) Prior Publication Data

US 2021/0048227 A1 Feb. 18, 2021

Related U.S. Application Data

(62) Division of application No. 15/638,440, filed on Jun. 30, 2017, now abandoned.

(60) Provisional application No. 62/493,365, filed on Jun. 30, 2016.

(51) Int. Cl.
| | |
|---|---|
| *F24S 70/30* | (2018.01) |
| *F24S 70/225* | (2018.01) |
| *H01L 31/0216* | (2014.01) |
| *H01L 31/18* | (2006.01) |
| *F24S 70/16* | (2018.01) |
| *F24S 70/25* | (2018.01) |

(52) U.S. Cl.
CPC ............. *F24S 70/225* (2018.05); *F24S 70/16* (2018.05); *F24S 70/25* (2018.05); *F24S 70/30* (2018.05); *H01L 31/02168* (2013.01); *H01L 31/18* (2013.01); *Y02E 10/40* (2013.01)

(58) Field of Classification Search
CPC .......... F24S 70/225; F24S 70/25; F24S 70/30; F24S 70/16; H01L 31/02168; H01L 31/18; Y02E 10/40; Y02E 10/50
See application file for complete search history.

(56) References Cited

U.S. PATENT DOCUMENTS

2017/0133534 A1 5/2017 Ko et al.

FOREIGN PATENT DOCUMENTS

| FR | 2935841 | * | 3/2010 |
| WO | 2010065635 A2 | | 6/2010 |

OTHER PUBLICATIONS

Allred et al., "Spectrally Selective Surfaces by Chemical Vapor Deposition", Solar Energy Materials, 1985, pp. 87-129, vol. 12.
Arpin et al., "Three-dimensional self-assembled photonic crystals with high temperature stability for thermal emission modification", Nature Communications, 2013, pp. 1-8.
Cao et al., "A Review of Cermet-based Spectrally Selective Solar Absorbers", Energy Environ. Sci., 2014, pp. 1-33.
Cao et al., "Enhanced Thermal Stability of W—Ni—Al2O3 Cermet-Based Spectrally Selective Solar Absorbers with Irungsten Infrared Reflectors", Adv. Energy Mater., 2015, pp. 1-7, vol. 5.
Duffie et al., "Solar Engineering of Thermal Processes", John Wiley and Sons, Inc., Fourth Edition, 2013, pp. 1-928.

(Continued)

*Primary Examiner* — Alfred Basichas
(74) *Attorney, Agent, or Firm* — The Webb Law Firm

(57) ABSTRACT

A solar thermal energy device is provided. Also provided is a method of making a solar thermal energy device.

13 Claims, 10 Drawing Sheets
(5 of 10 Drawing Sheet(s) Filed in Color)

(56) References Cited

OTHER PUBLICATIONS

Fleming et al., "All-metallic three-dimensional photonic crystals with a large infrared bandgap", Nature, 2002, pp. 52-55, vol. 417.
Kraemer et al., "High-performance flat-panel solar thermoelectric generators with high thermal concentration", Nature Materials, 2011, pp. 532-538, vol. 10.
Lee et al., "Peel-and-Stick: Fabricating Thin Film Solar Cell on Universal Substrates", Scientific Reports, 2012, pp. 1-4.
Lee et al., "Peel-and-Stick: Mechanism Study for Efficient Fabrication of Flexible/Transparent Thin-film Electronics", Scientific Reports, 2013, pp. 1-6.
Lee et al., "Transfer Printing Methods for Flexible Thin Film Solar Cells: Basic Concepts and Working Principles", ACS Nano, 2014, pp. 8746-8756, vol. 8:9.
Lenert et al., "A Nanophotonic Solar Thermophotovoltaic Device", Nature Nanotechnology, 2014, pp. 126-130, vol. 9:2.
Lovegrove et al., "Concentrating solar power technology: Principles, developments and applications", Woodhead Publishing Limited, 2012, pp. 1-40.
Moon et al., "High performance multi-scaled nanostructured spectrally selective coating for concentrating solar Power", Nano Energy, 2014, pp. 238-246, vol. 8.
Nagpal et al., "Ultrasmooth Patterned Metals for Plasmonics and Metamaterials", Science, 2009, pp. 594-597, vol. 325.
Nam et al., "Solar thermophotovoltaic energy conversion systems with two-dimensional tantalum photonic crystal absorbers and emitters", Solar Energy Materials & Solar Cells, 2014, pp. 287-296, vol. 122.
Park et al., "Fabrication of Smooth Patterned Structures of Refractory Metals, Semiconductors, and Oxides via Iremplate Stripping", ACS Appl. Mater. Interfaces, 2013, pp. 9701-9708, vol. 5.
Rephaeli et al., "Absorber and emitter for solar thermophotovoltaic systems to achieve efficiency exceeding the Shockley-Queisser limit", Optics Express, 2009, pp. 15145-15159, vol. 17:17.
Schwede et al., "Photon-enhanced thermionic emission for solar concentrator systems", Nature Materials, 2010, pp. 762-767, vol. 9.
Shockley et al., "Detailed Balance Limit of Efficiency of p-n Junction Solar Cells", Journal of Applied Physics, 1961, pp. 510-519, vol. 32:3.
Thornton et al., "Thermal Stability Studies of Sputter-Deposited Mul Ti Layer Selective Msorber Coatings", Thin Solid Films, 1982, pp. 175-183, vol. 96.
Yeng et al., "Enabling high-temperature nanophotonics for energy applications", PNAS, 2012, pp. 2280-2285, vol. 109:7.
Zhou et al., "Metal-Core/Semiconductor-Shell Nanocones for Broadband Solar Absorption Enhancement", Nano Lett, 2014, pp. 1093-1098, vol. 14.
Zhu et al., "Nanodome Solar Cells with Efficient Light Management and Self-Cleaning", Nano Lett, 2010, pp. 1979-1984, vol. 10.

* cited by examiner

1. Interference Lithography
2. KOH Etching
3. HF Etching
4. Ni Sputtering
5. Ni Electrodeposition
6. Template Stripping

SOLAR ENERGY CONVERTER AND RELATED METHODS

CROSS REFERENCE TO RELATED APPLICATIONS

This application is a Divisional of U.S. patent application Ser. No. 15/638,440 filed Jun. 30, 2017, which claims the benefit of U.S. Provisional Patent Application No. 62/493,365, filed Jun. 30, 2016, each of which is incorporated herein by reference in its entirety.

STATEMENT REGARDING FEDERAL FUNDING

This invention was made with government support under Grant No. CBET-1253692 awarded by the National Science Foundation. The government has certain rights in the invention.

Provided herein are solar thermal energy converter devices and methods of making and using the devices.

At present, the conversion of solar energy into electricity mainly relies on two approaches: solar photovoltaics that convert solar photons directly into electricity, and solar thermal energy conversion in which solar photons are first converted into thermal energy, then converted to electricity. Compared to traditional photovoltaics, one major advantage of solar thermal energy conversion is the utilization of nearly the entire solar spectrum, allowing for higher energy conversion efficiency. In solar thermal technologies, such as concentrated solar power, solar thermophotovoltaic, solar thermionic, and solar thermoelectric systems, solar absorbers are crucial components that absorb and convert sunlight into thermal energy. In order to achieve the maximum conversion efficiency of incident solar flux to heat, one important strategy is to employ spectrally selective solar absorbers that exhibit a near-blackbody absorption in the solar spectrum while suppressing infrared emission at elevated temperatures. However, developing cost-effective and large-scale solar selective absorbers with both high conversion efficiency and high temperature stability remains a challenge.

For mid- and high-temperature operations of solar thermal systems, especially concentrated solar power systems, the development of high-performance solar selective absorbers has been challenging due to a variety of factors such as spectral performance, material stability at high temperatures, and manufacturing cost. Metal-dielectric multilayer structures can achieve a good spectral selectivity because of the interference effect. However, the use of these multilayer structures in practice is limited by both high-temperature instability and high-cost fabrication such as sputter deposition and electron beam evaporation. Semiconductor-metal structures utilize semiconductors with proper bandgaps to absorb solar radiation, and an underlying layer of metal to provide high infrared reflectance. A selective coating with Si—Ge nanoparticles has recently been demonstrated to have a measured solar absorptivity ~90% and an infrared emissivity <30% (J. Moon, et al., High performance multi-scaled nanostructured spectrally selective coating for concentrating solar power Nano Energy 2014, 8:238-246). The main drawback of the semiconductor-metal composition is the non-flexible spectral selectivity due to the intrinsic bandgaps of semiconductors. Cermet-based coatings made of ceramic-metal composites have also been developed and studied for use in solar selective absorbers. Thin single or multiple cermet layers are typically deposited on a metal surface for high solar absorptance while being transparent to infrared radiation. Although various combinations of host ceramics such as $Al_2O_3$, AlN, and $SiO_2$ with metal particle fillers including Ni, Co, Mo, W, Au, Ag, etc., have been extensively investigated in terms of spectral performance and thermal stability, it is still quite difficult to develop high-performance cermet-based absorbers stable at >700° C. Nanophotonic structures, e.g., 1D, 2D, and 3D photonic crystals, have been explored for use as solar selective absorbers, but these structures are far from meeting the goal of ~100% absorptance for the broad-band solar spectrum. Moreover, these nanophotonic structures are fabricated through high-cost and complex processes, such as reactive ion etching (RIE), atomic layer deposition (ALD), chemical mechanical planarization (CMP), and cannot be easily scaled up.

In view of the above, an easily and inexpensively-made, thermally-stable device having high visible-light absorptance and high IR reflectivity is desirable.

SUMMARY

Metal-based wafer-scale nanophotonic solar selective absorbers with excellent solar selective absorptivity and thermal stability are provided. Also provided is a template (mold) stripping method which can drastically increase throughput and decrease fabrication cost of the absorbers. The novel solar selective absorbers with three-dimensional (3D) nanophotonic structures can significantly facilitate transformative advancements in the design and performance of solar thermal systems.

A solar device is provided, comprising, a metallic substrate comprising a plurality of protuberances each having a base having an edge or a diameter, and an apex, and tapering from the base to the apex, wherein the distance between the base of adjacent protuberances is less than 200 nm, and the diameter and/or length of a side of the base ranges from 100 nm to 1000 nm.

A template for producing a solar device also is provided, comprising a substrate having a major surface comprising a plurality of indentations, each of the plurality of indentations having an opening at the major surface (that is, coplanar with the major surface), wherein the openings are spaced less than 200 nm apart, and the opening of each of the plurality of indentations having a side length or a diameter ranging from 100 nm to 1000 nm.

Further, a method of making a solar thermal absorbing device is provided. The method comprises, depositing a metal layer onto a template, comprising a substrate having a major surface comprising a plurality of indentations, each of the plurality of indentations having an opening at the major surface (that is, coplanar with the major surface), wherein the openings are spaced less than 200 nm apart, and the opening of each of the plurality of indentations having a side length or a diameter (ranging from 100 nm to 1000 nm, wherein the metal is deposited in an amount to fill in the indentations of the template and to produce a contiguous metal layer, optionally having a thickness of from 1 µM to 100 µM over at least a portion of the major surface of the template comprising the indentations; and releasing (e.g., peeling or delaminating) the deposited metal layer from the template to produce a metallic substrate having a major surface, comprising a plurality of protuberances on the major surface, each of the plurality of protuberance having a base having an edge or a diameter, and an apex, and tapering from the base to the apex, wherein the distance between the base of adjacent protuberances is less than 200 nm, and the diameter or an edge of the base ranges from 100 nm to 1000 nm.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

(FIG. 4A) Schematic of the solar thermal system. (FIG. 4B) The left area (with peak less than 1 µM) and right area (with peak at approximately 3 µM) indicate the solar spectrum and the blackbody radiation spectrum at 1000 K, respectively. The dashed line is the spectral absorptivity of an ideal solar absorber.

(FIG. 5A) Fabrication flow of the solar selective absorber. (FIG. 5B) SEM image of the fabricated nanopyramid structures. Scale bar: 3 µm. (FIG. 5C) A photograph of the flexible solar absorber.

(FIG. 6A) Schematic of nickel nanopyramid arrays with an ARC layer. Maximized overall efficiencies at concentration factors (FIG. 6B) C=1, (FIG. 6C) C=100, and (FIG. 6D) C=1000. (FIG. 6E) Averaged absorptivity spectrum at different incident angles 8 for I=500 nm, d=100 nm, and h=75 nm.

(FIG. 7A) Spectral absorptance from both experiment and simulation. The solid curves are the measured results from experiments, and the dashed curves are from simulations. (FIG. 7B) Measured spectral absorptance for a bare nickel plate, P600 sample with/without ARC, and P800 sample with/without ARC.

(FIG. 8A) Solar selective absorptance before (solid curve) and after 800° C. annealing in vacuum for >5 hours (dashed curve). (FIG. 8B) SEM image of the nanoprymid arrays after 800° C. annealing. Scale bar: 3 µm.

DETAILED DESCRIPTION

Figure 1:
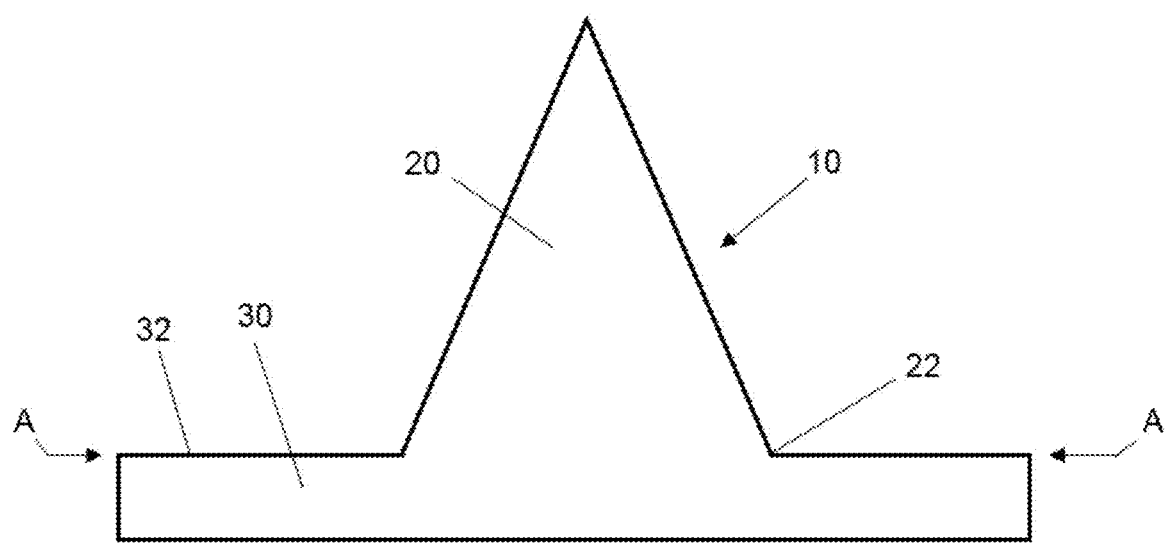
FIG. 1 is a schematic cross-sectional view of a portion of one aspect of a solar device as described herein.

As used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like.

The terms "formed over", "deposited over", or "provided over" mean formed, deposited, or provided on but not necessarily in contact with the surface. For example, a coating layer "formed over" a substrate does not preclude the presence of one or more other coating layers or films of the same or different composition located between the formed coating layer and the substrate. Likewise, the terms "under" or "between" in the context of specified coating layers does not preclude the presence of one or more other coating layers or films of the same or different composition located between the recited layers. The term "film" refers to a coating region of a desired or selected coating composition. A "layer" can comprise one or more "films", and a "coating" or "coating stack" can comprise one or more "layers".

The terms "visible region" or "visible light" refer to electromagnetic radiation having a wavelength in the range of 380 nm to 800 nm. The terms "infrared region" or "infrared radiation" refer to electromagnetic radiation having a wavelength in the range of greater than 800 nm to 100,000 nm. The terms "ultraviolet region" or "ultraviolet radiation" mean electromagnetic energy having a wavelength in the range of 300 nm to less than 380 nm.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Depictions of various aspects of the invention and elements thereof in the figures, such as coating layers, are not necessarily to scale, but are drawn in a manner to better illustrate and to facilitate description of the described structure.

According to one aspect of the invention, provided herein is a solar device that comprises a metallic substrate comprising a plurality of protuberances each having a base having an edge or a diameter, and an apex, and tapering from the base to the apex, e.g., the area of a cross section of the protuberance parallel to the base decreases from the base to the apex. The device is exceptionally efficient, with a theoretical solar-to-electrical conversion efficiency (e.g., $\eta_m$, as described below) of at least 30% for non-concentrated light, and at least 50% for concentrated solar light (e.g., 100-fold, or 1000-fold, for example, as in solar concentrator or reflector arrays). The device performs as a near perfect reflector in the infrared range, with reflectivity close to 100% (i.e., ~0% emissivity), e.g., greater than 90% at wavelengths greater than 1 µm, while being an excellent absorber for visible light with an average absorbitivity larger than 95%.

In various aspects, the distance between the base of adjacent protuberances is less than 200 nm, and the diameter and/or length of a side of the base ranges from 100 nm to 1000 nm. In one aspect, the device further comprises an antireflective coating having a refractive index greater than one and less than the maximum refractive index of the metallic substrate at the base of the protuberances.

In aspects, the metal substrate and protuberances are a unified structure that can be prepared from any heat-stable metal and/or alloy or combination of metals and/or alloys, stable at operational temperatures of the device, e.g., at 800° C. As described herein, nickel and alloys thereof are suitable metals and alloys. In other aspects, copper and alloys thereof are suitable metals and alloys. Examples of other suitable metals include: silver, gold, and alloys thereof. The substrate and protuberances may comprise the same metallic substance, or can be of different metallic substances. As described below, the method of manufacturing of the device allows for use of different metallic substances for the substrate and the protuberances.

Metal layers, such as the metallic substance used to produce the device described herein manufactured, e.g., on a silicon template as described below, can be deposited by any useful physical or chemical deposition methods, as are broadly-known in the semiconductor and optical arts, such as, without limitation physical vapor deposition (PVD), chemical vapor deposition (CVD), sputtering, chemical plating, electroplating, plasma-enhanced CVD (PECVD) and electron beam physical vapor deposition (EBPVD). Often, the method used to deposit the metallic substance will vary depending upon the composition of the metallic substance, but an appropriate deposition method can be determined depending upon the metallic substance to be deposited. In one example, the metal layer is deposited on a template by a combination of sputtering, followed by electroplating (applying a charge to a metallic "electrode" prepared by sputtering or any deposition process). Other layers, such as the antireflective coating layer, also may be deposited by any useful physical or chemical deposition method, e.g., as described above for the metallic layer, including PVD and CVD methods.

Figure 5A:
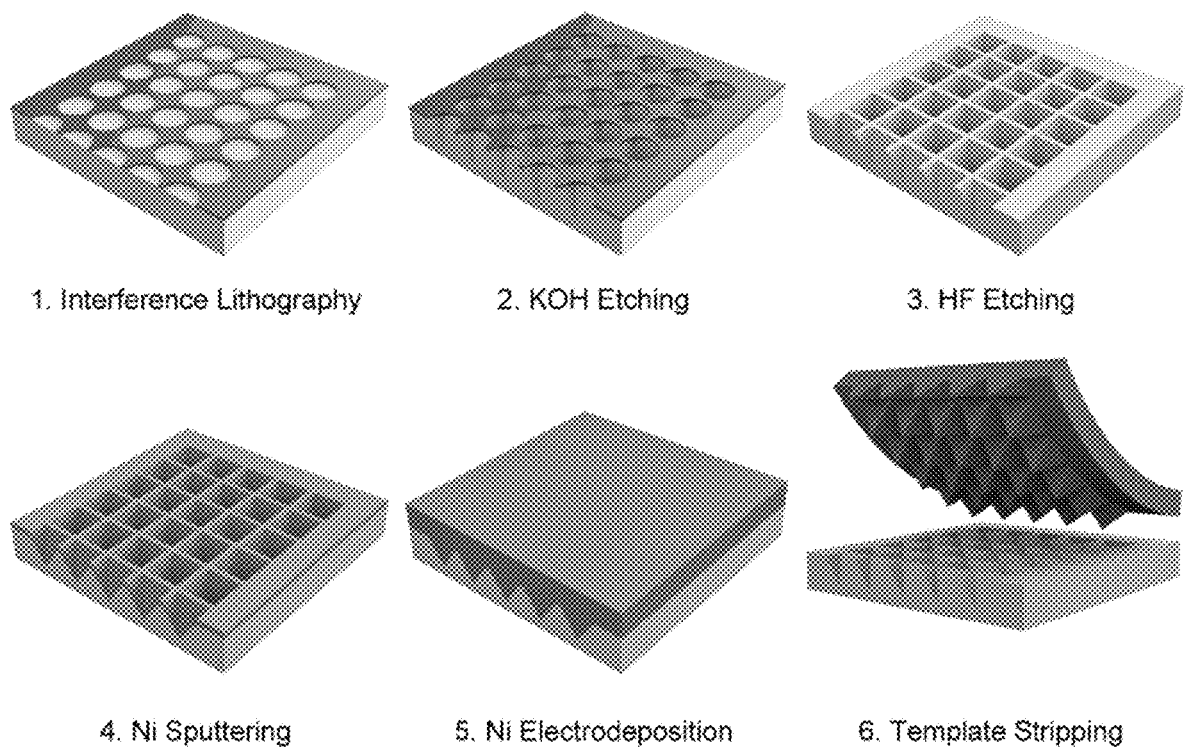
FIGS. 5A-5C. Fabrication of nanopyramid arrays as a solar selective absorber.
Figure 5B:
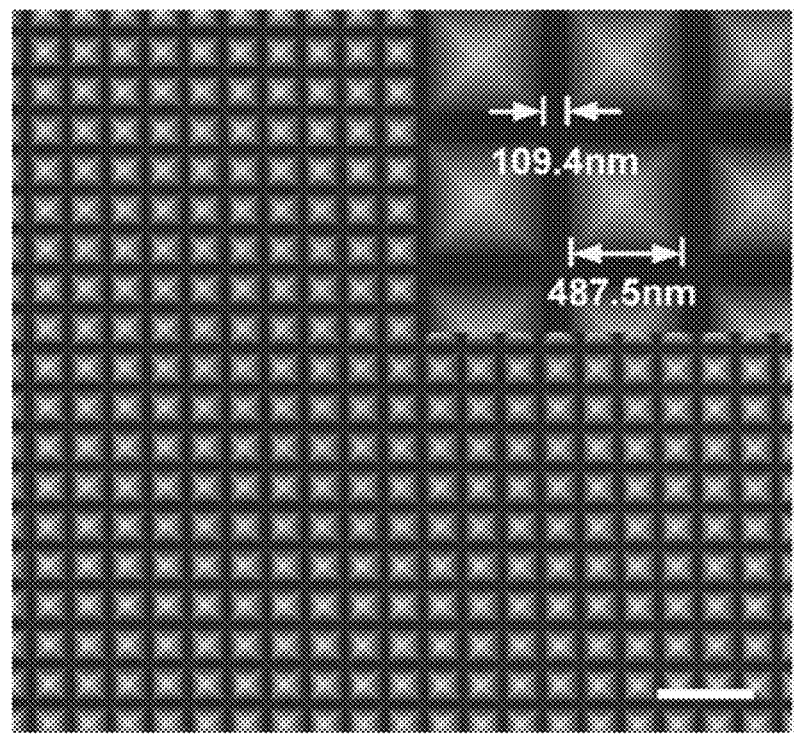
Figure 6A:
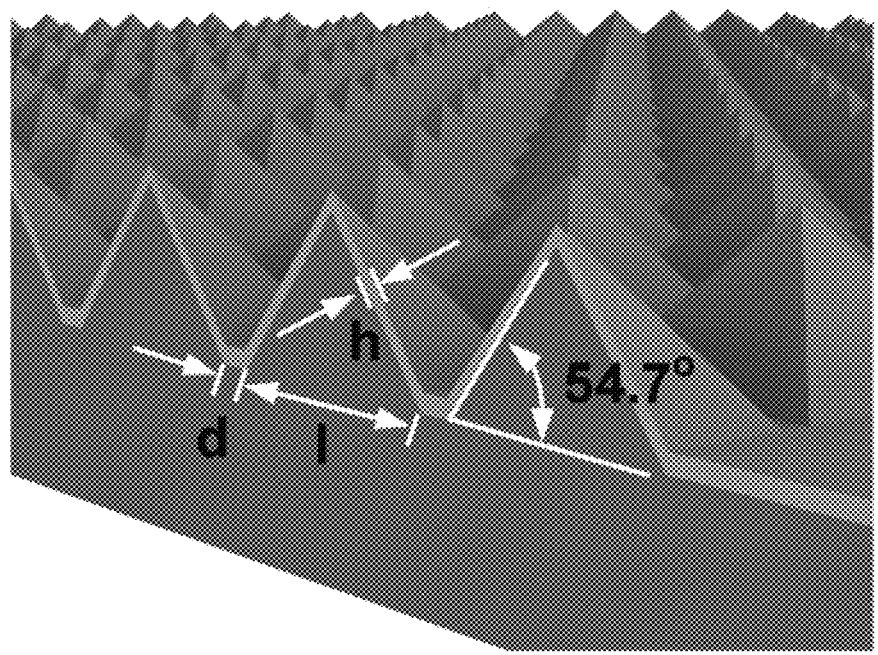
FIGS. 6A-6E. Optimization of solar absorber geometries.

In aspects, the protuberances are arranged in any pattern on the substrate, for example, as depicted in FIGS. 5B and 6A, below. The protuberances are typically arranged on the substrate as an array, and depending on the design and desired separation between protuberances, e.g., ranging from 0 nm to 200 nm apart, an array (a regular pattern) of protuberances may be utilized. In one aspect, the array of protuberances is periodic, in that the protuberances are arranged in a repeating, e.g., uniform, pattern, for example, on a grid, or other geometric pattern. As indicated below, the structure absorbs optimally as the distance between protuberances approaches zero, and, thus, the protuberances can be tiled on the substrate in any periodic or aperiodic tesselation pattern.

Antireflective coatings are broadly-known in the optical and photonics fields, and are applied to reduce surface reflections. Antireflective coatings include ceramics, cements, dielectric films, and other substances, such as, without limitation metal oxides and metal nitrides. Non-limiting examples of metal oxides useful for inclusion in the antireflective coating include oxides nitrides and fluoride of aluminum, hafnium, titanium, and/or zirconium, such as, without limitation: $Al_2O_3$, AlN, $SiN_x$ (with x being representative of the various oxidation states of silicon), $MgF_2$, $TiO_2$, $ZrO_2$, $HfO_2$, and $SiO_2$, optionally with metal particle fillers including Ni, Co, Mo, W, Au, Ag, etc., added by sputtering. In one aspect, the antireflective coating is aluminum oxide. The antireflective coating may have any effective thickness. Useful thicknesses for the antireflective coating ranges from 10 nm to 200 nm, for example, from 50 nm to 100 nm, and in one aspect, from 65 nm to 80 nm, for example 70 nm or 75 nm. Other antireflective coatings useful in the device are coatings that are heat-stable at 800° C.

Other coatings, such as a protective coating able to withstand operational temperatures of the device, e.g., at least 800° C., may be deposited over the substrate and, when present optionally over the antireflective coating. Nevertheless, for purposes herein, the dimensions, and tapered shape of the protuberances must be substantially maintained in order to optimize solar absorption, such that any coatings over the metallic substrate of the protuberances are optimally less than 200 nm, e.g., less than 100 nm in total thickness.

According to one aspect of the invention, a portion of solar device 10 is depicted schematically in FIG. 1. Device 10 comprises a plurality of protuberances 20 (only one is depicted in FIG. 1) having a base 22, and a substrate 30, having a major surface 32 from which protuberances 20 extend. The base 22 of protuberance 20 is located at the plane of major surface 32 from which protuberance 20 extends. The base 22 of protuberance can be any shape, though the shape of the base 22, and protuberance 20 is often dictated by the crystal structure of a template, e.g., a silicon template as depicted herein, in which case the base 22 is square or rectangular.

Figure 2:
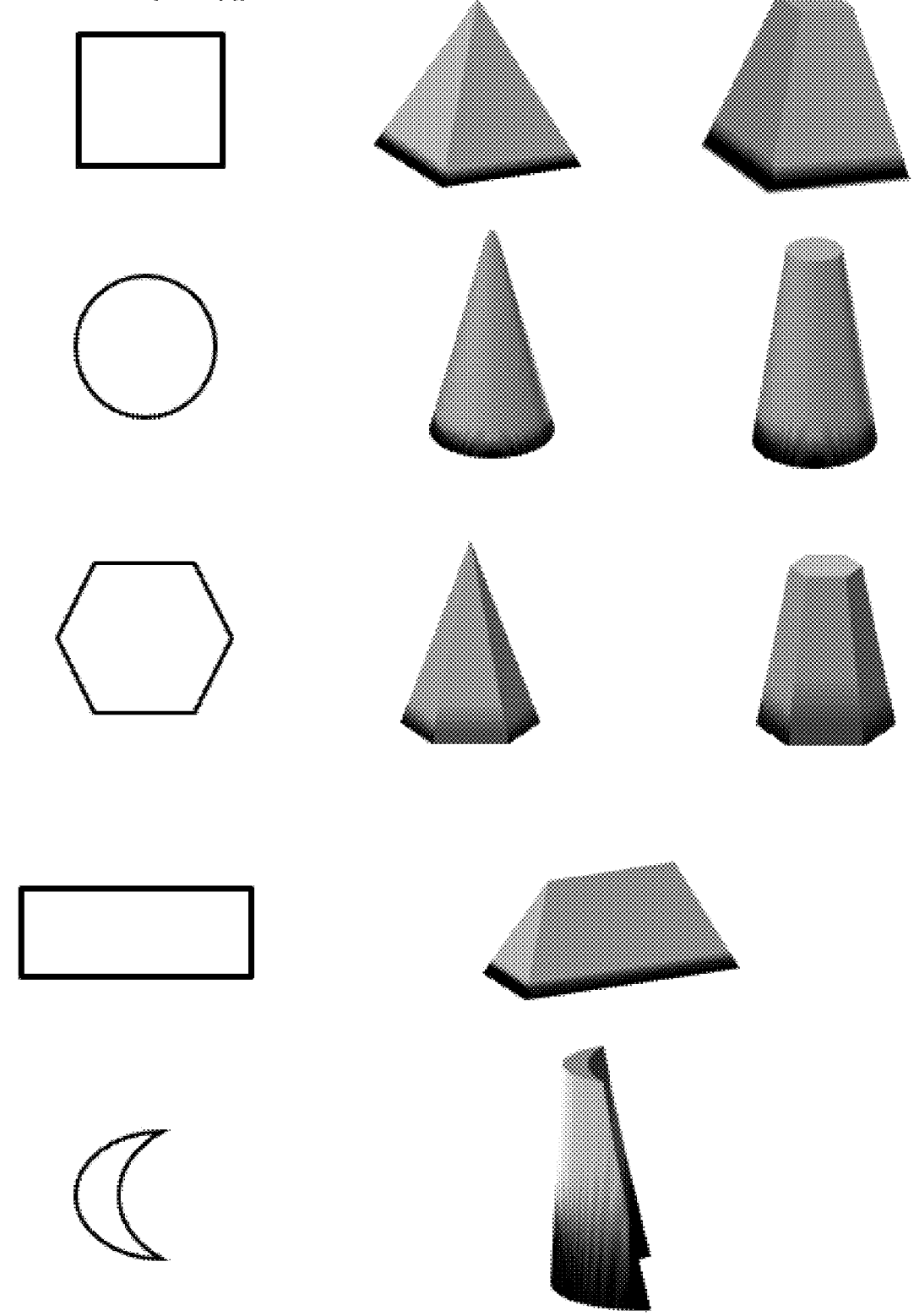
FIG. 2 depicts various exemplary shapes of protuberances, with the two-dimensional bases on the left (cross-section at A of FIG. 1), and three-dimensional depictions of protuberances having the depicted base to the right.

FIG. 2 depicts different shapes for the base (cross-section at A of FIG. 1), including convex square, circle, hexagon, and rectangular shapes, and also depicts three-dimensional protuberances that in the case of the square, circle, and hexagon are depicted both as pyramidal or conical and frusto-pyramidal, or frusto-conical. In FIG. 2, the protuberance having a concave crescent base is only depicted as a frusto-pyramid, and the protuberance having a rectangular shape is only depicted as a pyramid.

The base of a protuberance may be any two-dimensional closed shape, such as a polygon, e.g., a regular polygon, or curved (circular, oval, etc.), closed shape that can be convex or concave. In one aspect, due to the use of etched crystalline, e.g., silicon, templates for the substrate, the closed shape is a convex polygon, and may be a regular polygon, e.g., a square or rectangle, and the protuberance is a pyramid or frusto-pyramid. An effective diameter of the base is the length of a line segment passing thorough the centroid of the base of the protuberance and having end points on the boundary of the two-dimensional closed shape of the base of the protuberance, and for concave shapes, the end points of the segment are points on the boundary most distal to (farthest from) the centroid. The base of the protuberance is coplanar with a surface of the contiguous portion of the metallic substrate from which the protuberance extends, and the apex of the protuberance is a point or two-dimensional shape most distal to the base of the protuberances. A cone or conical shape has a curved base that can be circular, oval, elliptical, or any curved shape.

In aspects, heat generated by the solar thermal device described herein can be used for any purpose. In one aspect, the device is used as a general purpose thermal device to heat air or water for use in thermal collection and distribution systems, e.g., for architectural heating, residential or commercial property heating or water heating. Alternatively, the heat is used for heating of materials for use in industrial processes, such as for heating water or other substances for use in chemical reactions, for heating furnaces, for solar desalinization (e.g., solar stills), etc. In another aspect, the device is used as part of a heat engine to generate work e.g., in the production of electricity, etc. as is broadly-known, such as for boiling water for use in a steam generation system.

In one aspect, a method of making a solar thermal absorbing device is provided. The method comprises depositing a metal layer onto a template, comprising a substrate having a major surface comprising a plurality of indentations, each of the plurality of indentations having an opening at the major surface (that is, coplanar with the major surface). In the template, the openings are spaced less than 200 nm apart, and the opening of each of the plurality of indentations having a side length or a diameter of the opening at the major surface ranging from 100 nm to 1000 nm, wherein the metal is deposited in an amount to fill in the indentations of the template and to produce a contiguous metal layer, optionally having a thickness of from 1 μM to 100 μM over at least a portion of the major surface of the template comprising the indentations; and stripping (e.g., releasing, peeling, or delaminating) the deposited metal layer from the template to produce a metallic substrate having a major surface, comprising a plurality of protuberances on the major surface, each of the plurality of protuberance having a base having an edge or a diameter, and an apex, and tapering from the base to the apex, wherein the distance between the base of adjacent protuberances is less than 200 nm, and the diameter or an edge of the base ranges from 100 nm to 1000 nm. In one aspect, the template is a silicon substrate having a major surface comprising a layer of native oxide or silica coating, and the indentations are pyramidal indentations with a square or rectangular opening at the major surface. The shape and height of the indentations are a consequence of the process of etching the silicon blank with KOH, resulting in a pyramidal indentation having sides at an angle of 54.7° relative to the plane of the major surface of the silicon template. The metal layer may be deposited onto the template by any useful deposition method, e.g., as described herein, for example, by sputtering the metal onto the major surface of the substrate to fill in the indentations and to produce a thin coating of the metal over the major surface, followed by electrodeposition (e.g., electroplating) of the metal, or a metal that can be the same or a different metal or alloy as the sputtered metal, onto the sputtered metal. In aspects, the deposited metal is nickel, copper, gold, silver, or an alloy thereof, e.g., an alloy with tungsten, such as a nickel-tungsten alloy.

Figure 3:
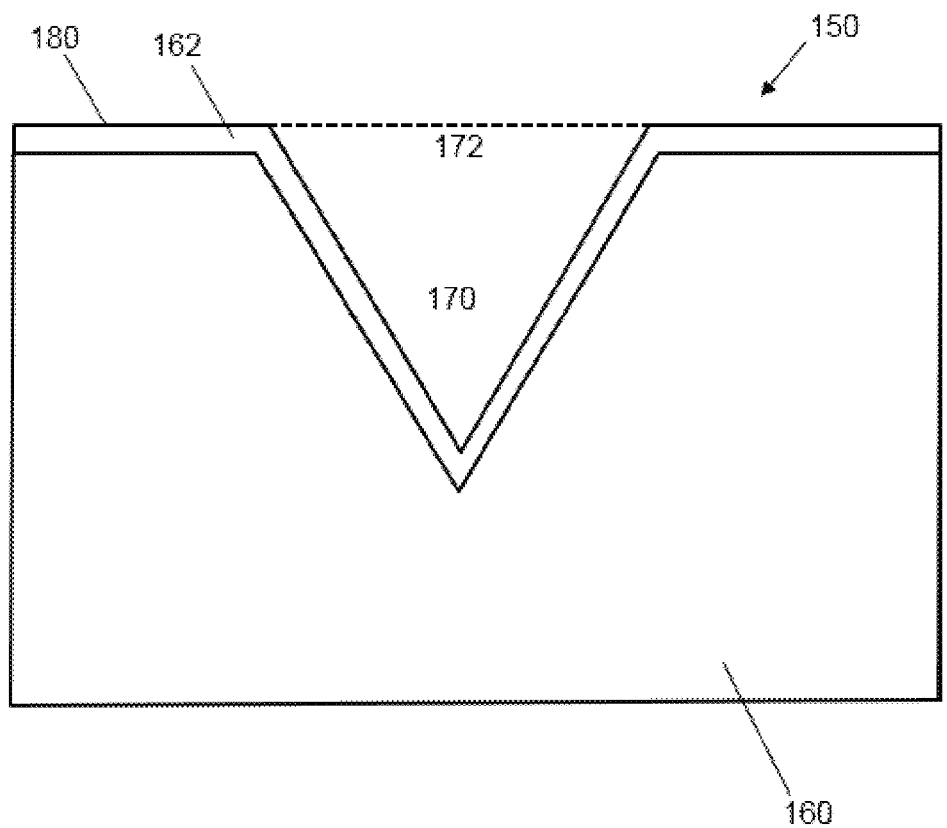
FIG. 3 is a schematic cross-sectional view of a portion of one aspect of a template showing a single indentation, for use in production of a solar device as described herein.

According to one aspect of the invention, in reference to FIG. 3, a template 150 is provided. The template 150 comprises a substrate 160 having an oxide coating 162. In one example, the substrate 160 is a silicon substrate, and the coating 162 is silica. FIG. 3 depicts only a portion of a template 150, depicting a single indentation 170, while a complete template would include a plurality of indentations, e.g., in an array. The template 150 has a major surface 180, and the indentation 170 has an opening 172, with the dotted line indicating the plane of the major surface 180.

The method optionally further comprises depositing an antireflective coating over at least a portion of the metallic substrate including the plurality of protuberances. The antireflective coating is as described herein, and may be a metal oxide or a silicon nitride, such as aluminum oxide ($Al_2O_3$) or silicon nitride ($SiN_x$), deposited over the metallic substrate to a thickness of from 50 nm to 1 μm, e.g., from 65 nm to 80 nm, for example, 70 nm or 75 nm.

In aspects, the protuberances are pyramidal, conical, frusto-pyramidal, or frusto-conical, and in one aspect, the protuberances are pyramidal, having a square or rectangular base, and wherein a plane containing a side of the protuberance is at an angle of 54.7 degrees from the plane of the major surface of the contiguous portion of the metallic substrate from which the protuberance extends. In one aspect, the distance between the bases of adjacent protuberances is less than 50 nm. In another aspect, the protuberances are uniformly or periodically spaced on the substrate to form an array.

EXAMPLE 1

Design of Solar Absorber

Figure 4A:
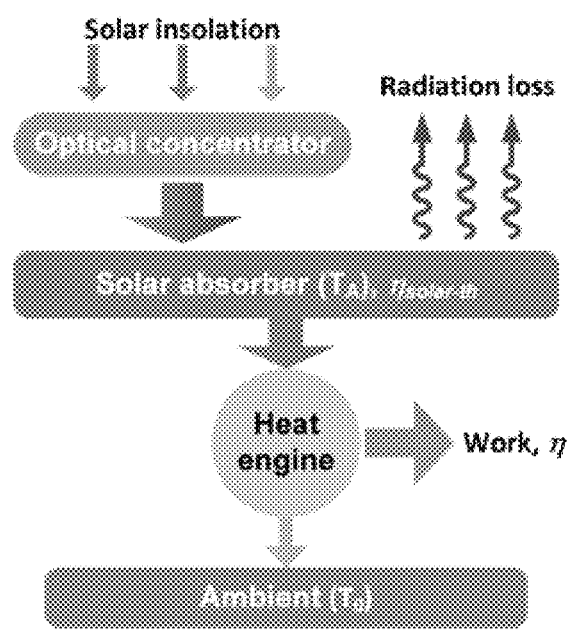
FIGS. 4A and 4B. Solar selective absorber in a solar thermal system.

An optimal solar absorber needs to maximize the solar-to-electrical energy conversion. The solar-to-electrical conversion efficiency η of a solar thermal system (FIG. 4A) can be calculated by multiplying the solar-to-thermal conversion efficiency $\eta_{solar-th}$, which is exclusively determined by the properties of the solar absorber, and the thermal-to-electrical energy conversion efficiency $\eta_{th-e}$. The theoretical maximum of $\eta_{th-e}$ is the Carnot efficiency, namely $\eta_{th-e}=1-T_0/T_A$, where $T_0$ is the ambient temperature and $T_A$ is the working temperature of the solar absorber. As a result, one can quantitatively characterize the performance of the solar absorber by the overall efficiency of the solar thermal system:

$$\eta = \eta_{solar-th} \times \left(1 - \frac{T_0}{T_A}\right), \qquad (1)$$

where $\eta_{solar-th}$ is a function of the frequency-dependent absorptivity $\alpha(\lambda)$ and the working temperature of the solar absorber. Based on energy balance equation, $\eta_{solar-th}$ can be explicitly expressed as:

$$\eta_{solar-th} = \frac{C \times \int d\lambda \cdot \alpha(\lambda) \cdot E_{solar}(\lambda) - \int d\lambda \cdot \alpha(\lambda) \cdot E_B(\lambda, T_A)}{C \times \int d\lambda \cdot E_{solar}(\lambda)}, \qquad (2)$$

where $E_{solar}$ is the spectral solar irradiation, $E_B(\lambda, T_A)$ is the blackbody radiation at temperature $T_A$, and C is the concentration factor that is usually on the order of 10~1000. It is worth noting that if the absorber is placed in air, the convection loss through air also needs to be considered in addition to radiation loss.

Figure 4B:
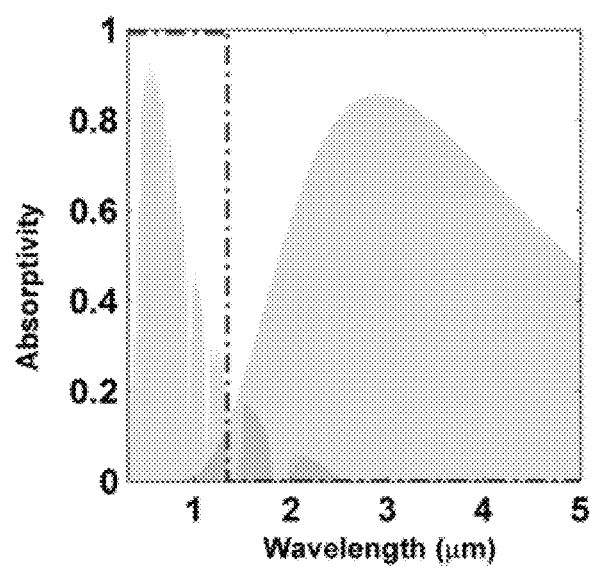

Ideally, solar absorbers should have a step-function like spectral selection with 100% absorption for the solar spectrum and 0% emission for the infrared range, where the "cut-off" wavelength is located at the intersection of C×$E_{solar}$ and $E_B$, as illustrated in FIG. 4B. However, in reality, there exists no optical structure reaching this ideal performance. For any realistic structure, detailed spectral absorptivity/emissivity ($\alpha(\lambda)$) needs to be considered for both sunlight and thermal infrared radiation (at $T_A$). In Equation (1), increasing $T_A$ leads to a higher Carnot efficiency, but simultaneously reduces $\eta_{solar-th}$ due to an increasing radiation loss. Thus, for a given solar absorber, considering its specific structure (e.g., multilayer or 3D photonic crystals) and material, and the concentration factor C, one can find its optimized geometry and working temperature $T_A$ by maximizing the overall conversion efficiency η.

The solar devices described herein are solar selective absorbers based on light trapping principles. In aspects of the invention, metals are chosen as the absorber base materials because they are usually stable at high temperatures and have a high reflectance (thus, low emittance) in the infrared range. For the infrared light whose wavelength is much larger than the size of nanopyramids, the nanopyramid structure performs as a perfect reflector with reflectivity close to 100% (i.e., ~0% emissivity). On the other hand, the nanopyramid structure behaves like a perfect solar absorber in the solar spectrum due to the tapered subwavelength geometry of the nanopyramids, which generally exhibits broadband anti-reflection performance. The nanopyramids enhance solar absorption by matching the wave impedance between air and the metal substrate because the effective refractive index gradually changes from n=1 at the top to n=$n_{metal}$ at the bottom. To achieve an even better impedance match, a thin layer of an antireflective material, such as aluminum oxide ($Al_2O_3$) and silicon nitride ($SiN_x$), can be coated onto the nanopyramids, which increases the absorption by further mitigating the abrupt change of the effective refractive indexes at the top and bottom of the nanopyramids.

EXAMPLE 2

Manufacture of Solar Absorber

Figure 5C:
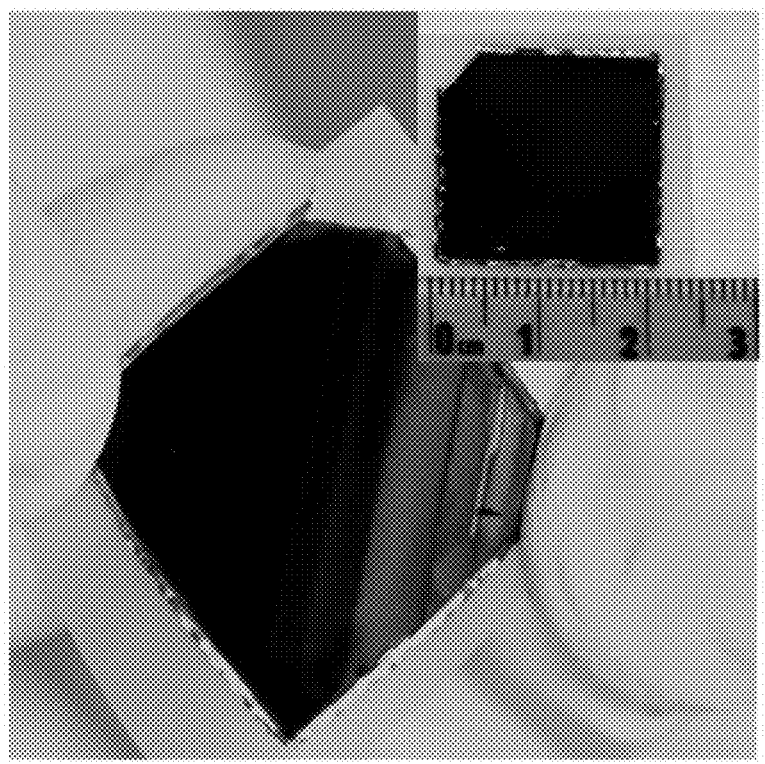

Large-scale nickel nanopyramid structures were manufactured using a template stripping method, as shown in FIG. 5A. The entire fabrication process starts with patterning a thin silicon nitride layer on a regular (100) silicon wafer. Using laser interference lithography, nanohole arrays are patterned onto the silicon nitride layer. This layer serves as a mask for anisotropic KOH etching, which results in inverted nanopyramids on the silicon wafer. After the etching step, the silicon nitride layer is removed with HF etching. The silicon wafer is then used as a template for rapid replication of the nanopyramids with nickel. A 100 nm thick nickel film is first sputtered on the silicon master template as a seed layer for electrochemical deposition. The replicating nickel layer can reach any desired thicknesses with electrochemical deposition. Due to water-assisted subcritical debonding between nickel and native oxide on the silicon wafer, the nickel layer with nanopyramid arrays can be readily peeled off from the silicon master template. The facets of the resulting nickel nanopyramids are atomically smooth and free of contamination (FIG. 5B inset). The stripped functional sheet can be attached to either flexible or rigid substrates of various materials depending on their target applications (FIG. 5C). Compared with the previous works using nanophotonic structures as selective surfaces, the large-scale nanofabrication process developed here is particularly cost-effective and robust because a variety of low-cost metals such as nickel, copper, and their alloys can be used.

After the peeling step, the silicon templates or molds retain their original conditions with little contamination or damage. Therefore, they can be reused many times, leading to a low-cost and high-throughput fabrication process.

EXAMPLE 3

Refinement of Structure of Solar Absorber

In order to maximize the energy conversion efficiency η, the aforementioned universal principle (Equations 1 and 2) was applied to optimize the design of nickel nanopyramid structures as solar selective absorbers. FIG. 6A shows the schematic of a nickel nanopyramid array produced on a silicon substrate. The shapes of all the pyramids are uniquely determined by the KOH etching of the (100) silicon wafer, where the angle equals 54.7 degrees. The selective absorption of nickel nanopyramid arrays is determined by the following parameters: (1) length of the pyramid edge l; (2) distance between adjacent pyramids d; and (3) thickness of the anti-reflection coating (ARC) h, all of which can be tuned in our fabrication process. The best design by maximizing η was numerically searched from all the possible cases with different combinations of l, d and h. For each case, direct numerical simulation was first performed to obtain the spectral absorptivity α(λ). Then, the maximum overall efficiency $η_m$ for this case is solved together with the optimized working temperature $T_A$ based on Equations 1 and 2. As a result, the best design of nickel nanopyramid arrays is determined by the case where $η_m$ reaches a global maximum.

Figure 6B:
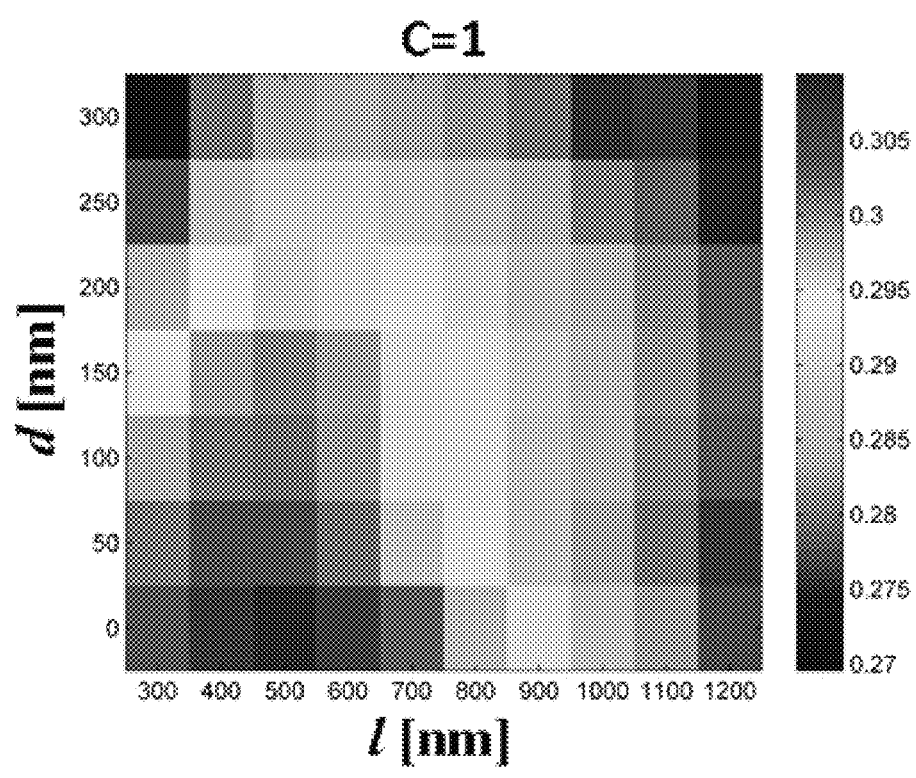
Figure 6C:
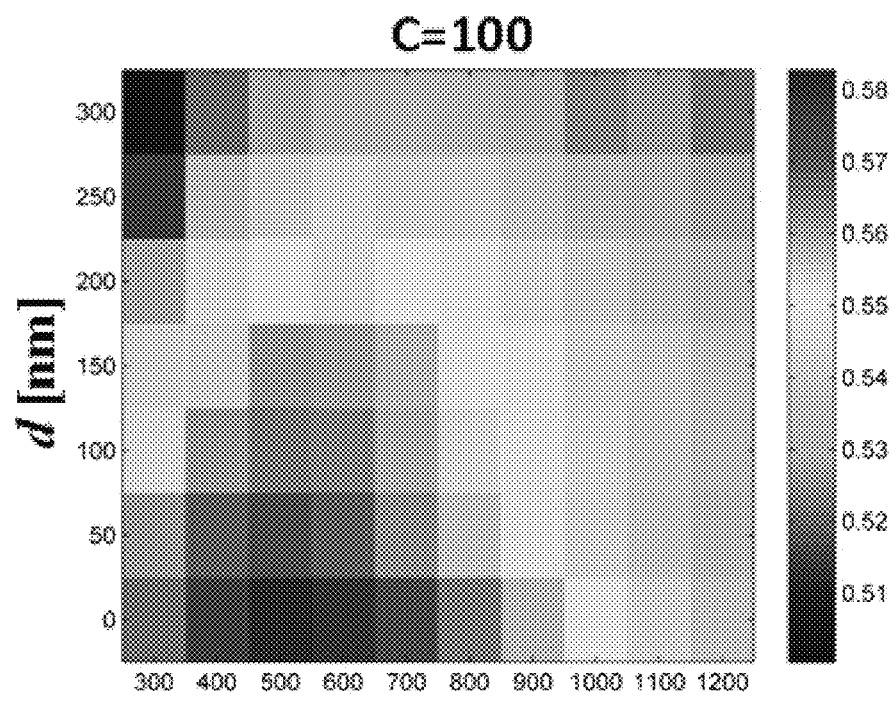
Figure 6D:
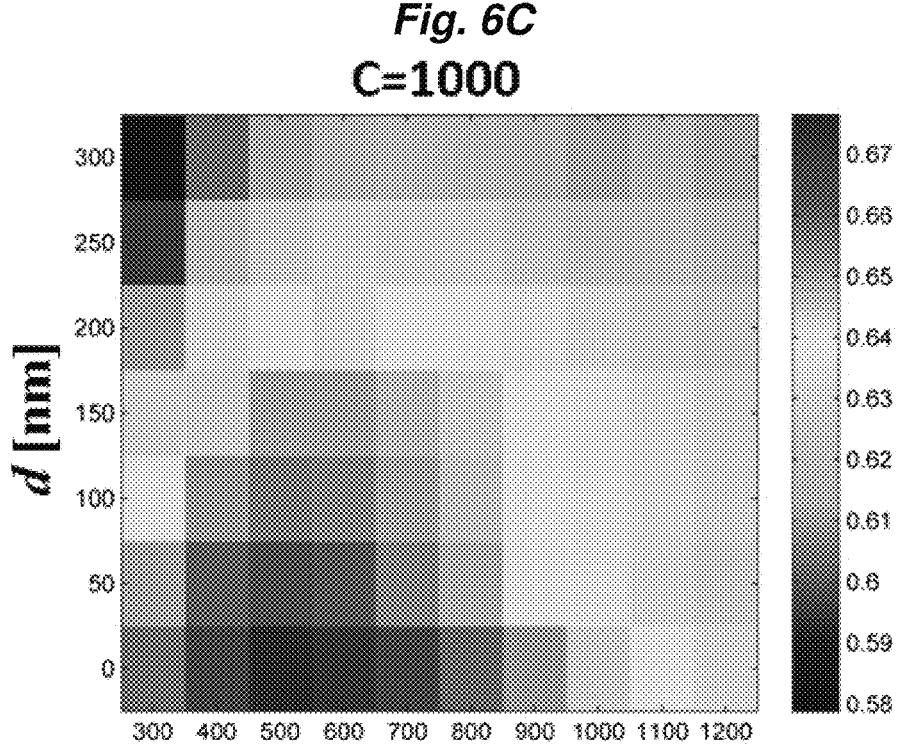

According to the numerical search results (FIGS. 6B-6E), the optimized design of the nickel nanopyramid arrays as selective solar absorbers needs to satisfy the following three criteria: (1) the length of pyramid edge l is about 500 nm; (2) the distance between adjacent pyramids d should be as small as possible; (3) the thickness of the anti-reflection coating h is around 70 nm as long as the pyramidal shapes are preserved after coating the pyramids with $Al_2O_3$. For the third criterion, the anti-reflection coatings with thickness h∈[70 nm, 300 nm] achieve very similar performance. However, we choose h~75 nm as the optimal design in order to lower fabrication cost. Furthermore, thick $Al_2O_3$ coatings will increase the thermal emission in the infrared range due to its optical phonon resonance. While our numerical search is based on solar concentration factor C=1, it turns out that the optimal design is insensitive to the variation of C. FIG. 6B-6D illustrates the maximized overall solar-to-electrical conversion efficiency $η_m$ for different combination of l and d at h=75 nm, for C=1, 100, 1000, respectively. The optimal dimensions for different C remain almost the same. For C=1000, TA=1000° C., the theoretical overall conversion efficiency $η_m$ with the optimized nanopyramid structures can be as large as 68%.

Figure 6E:
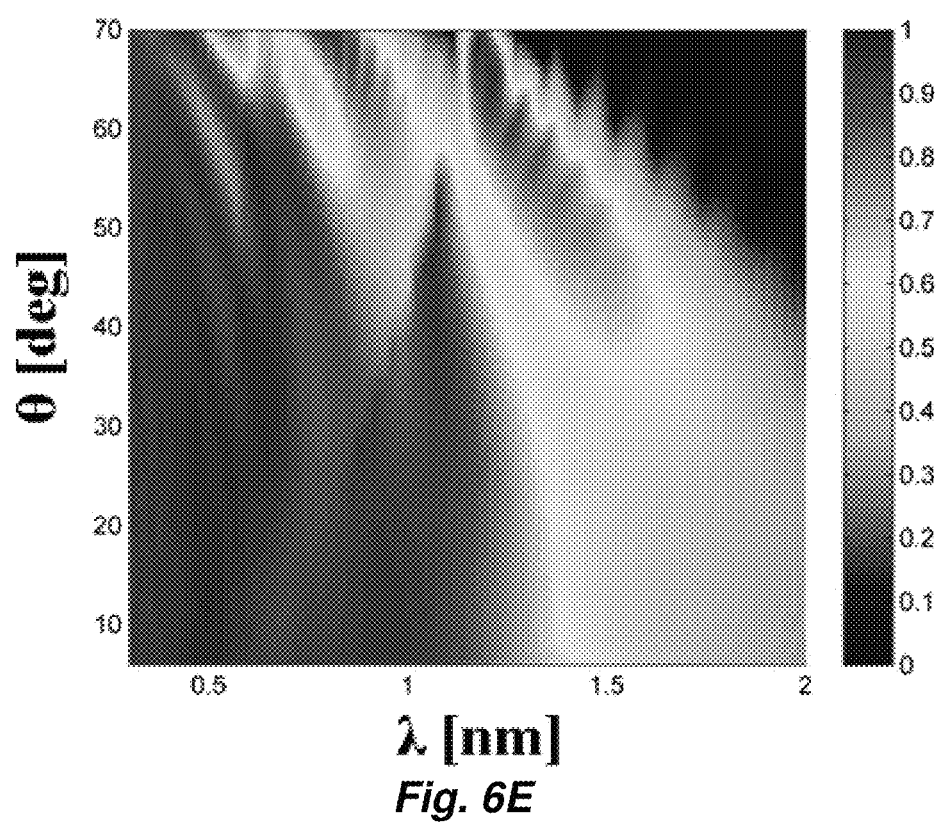

The angular dependency of the absorption spectrum of nickel nanopyramid arrays also was investigated. For the case of l=500 nm, d=100 nm and h=75 nm, the averaged absorptivity spectrum (the average of s-polarization and p-polarization contributions) was numerically evaluated for the incident angle θ up to 70° (FIG. 6E). The result shows that the selective absorption maintains almost the same for the angles in the range of ±50°, which indicates the omni-directional absorption of the nickel nanopyramid arrays.

Figure 7A:
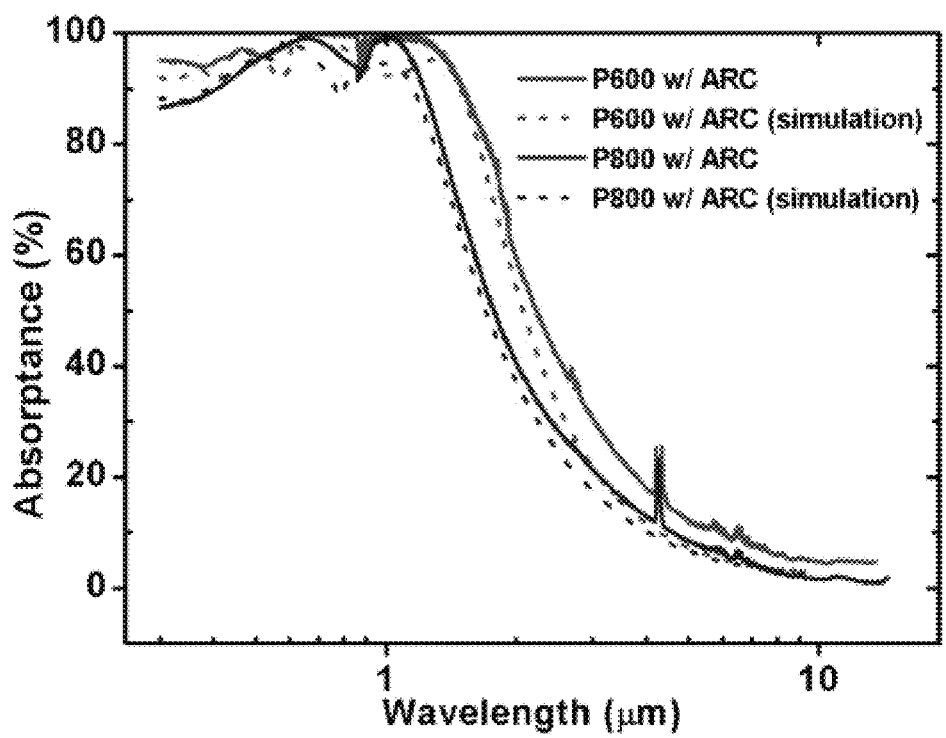
FIGS. 7A and 7B. Spectral absorptance of nanophotonic solar selective absorbers.
Figure 7B:
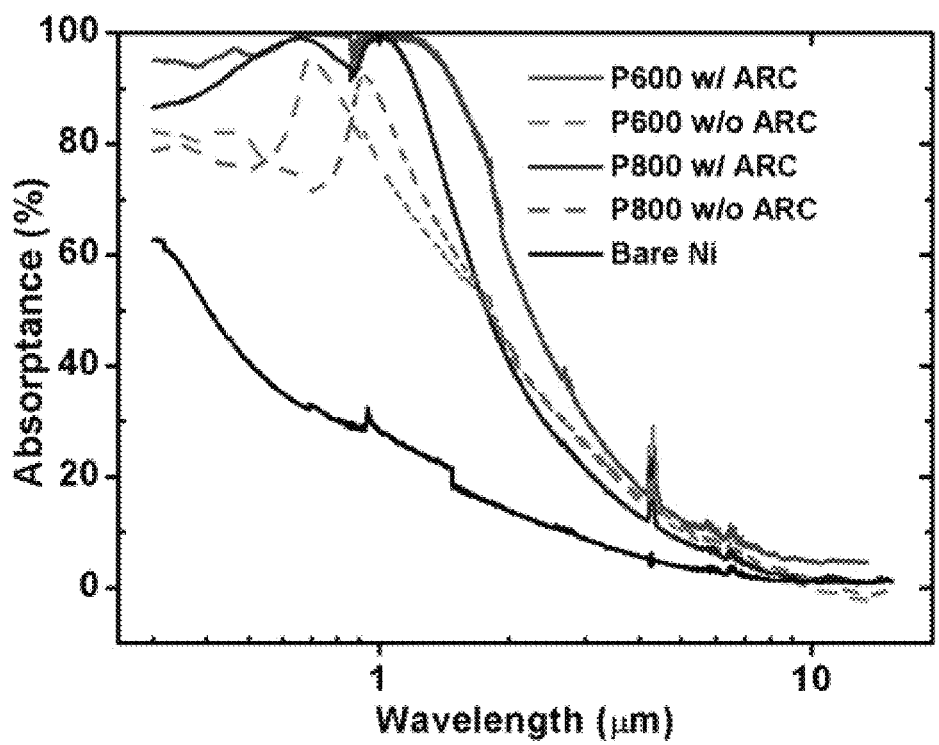

To characterize the selective absorption properties of the functional nickel sheet, two spectral measurement systems were used to cover the visible and infrared spectra with corresponding wavelength ranging from 300 nm to 10 μm. A Perkin Elmer LAMBDA 950 UV/Vis/NIR Spectrophotometer with a 150 mm diameter integrating sphere is used to measure the total absorptivity spectrum in the visible and near-infrared range. For the mid-infrared absorption measurement, a Thermo Scientific Nicolet iS50R FT-IR spectrometer is used with a gold mirror as a reference. Because the samples are all opaque to the electromagnetic waves in the aforementioned visible and infrared spectra, the absorptivity (A=1−R) of the samples was obtained by subtracting the measured reflectance (R). The spectral selective absorptance of the functional nickel sheets are shown in FIG. 4 with the spectrum spanning from visible to infrared range. Two types of samples were measured, one type has a nanopyramid pitch size of 800 nm ("P800"), the other type has a pitch size of 600 nm ("P600"). The P800 and P600 samples have base widths I=600±50 nm and I=500±30 nm, The thicknesses of $Al_2O_3$ ARC coatings are ~75 nm for both cases. The finite-difference time-domain (FDTD) simulated absorptivity of the nickel nanopyramid structures agrees well with our measurements (FIG. 7A). As shown in FIG. 7B, the absorption of bare nickel nanopyramids can be further enhanced by adding the ARC layer. The nanopyramids arrays with ARC layer are intrinsically complex. The small bumps and dips observed in their absorption spectrum may be caused by the combined photonic phenomena, such as interference, plasmonics and resonance, and the system errors of measurement instruments. The spectral absorptance of the functional nickel sheet clearly shows a highly selective characteristic over the measurement range. For the wavelength below about 1.3 μm, the average absorptance is ~0.95, which is almost two-fold higher than that of a flat nickel surface (FIG. 7B). Beyond a narrow transition range from 1 μm to 2.5 μm, the absorptance of the nickel sheet falls to a value as low as 0.1 for wavelengths >2.5 μm, which is remarkably beneficial for the low thermal emission in the infrared range.

Figure 8A:
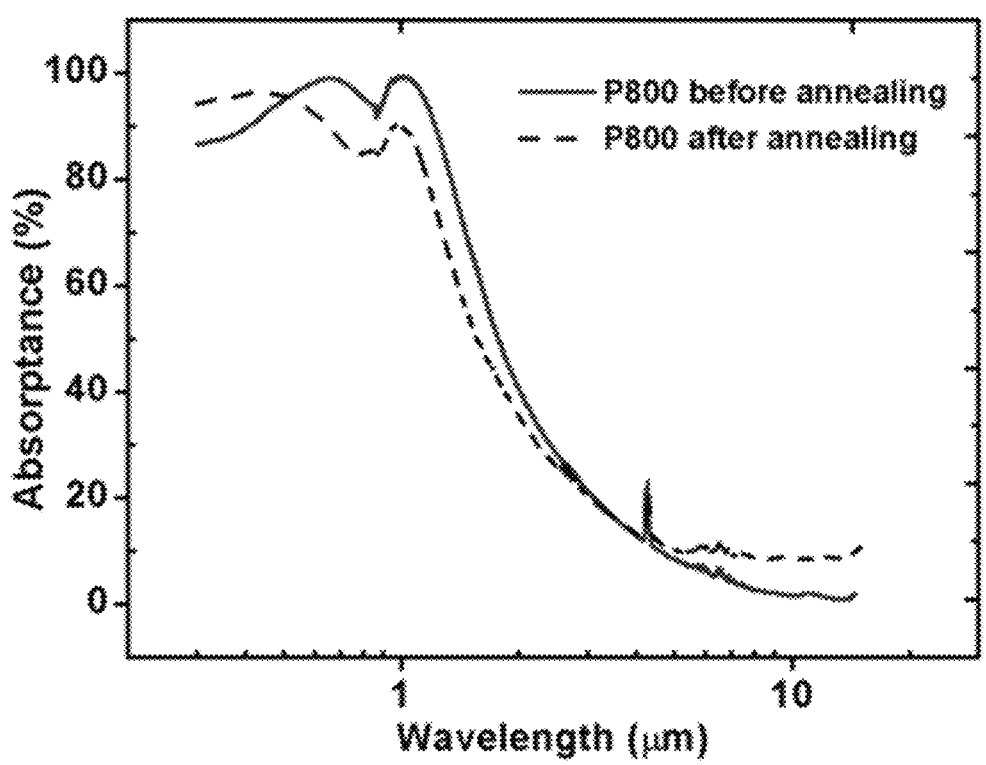
FIGS. 8A and 8B. Thermal stability test at high temperature.
Figure 8B:
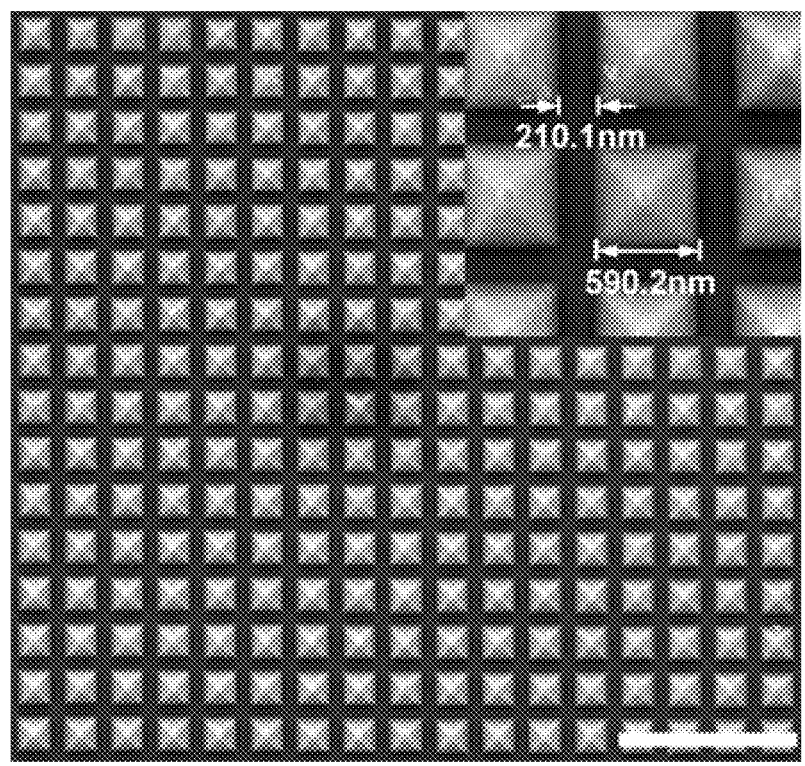

The stability of solar selective absorbers at high operating temperatures is of great importance for their practical application. A thermal annealing test is conducted using the samples fabricated with the aforementioned process. The fabricated solar absorbers are annealed at a temperature of 800° C. in vacuum (<1.5×10−5 Torr) for >5 hours. The spectral absorptance after annealing is slightly degraded compared to the original samples (FIG. 8A). In the wavelength range between 500 nm and 1 μm, a ~8% drop in absorption is observed, whereas a ~10% increase in absorption is in the infrared range (5-15 μm). This is probably due to phase transition or crystal growth during the annealing process which causes a slight change in the surface topography, or the oxidation of nickel in the medium high vacuum for annealing. Further investigation using scanning electron microscopy shows that the surface of nanopyramids becomes rougher after annealing, but the overall nanopyramid structures are still well maintained, as shown in FIG. 8B. The thermal stability test demonstrates that the nickel nanopyramids based solar absorbers have great potential for high temperature applications.

In summary, large-scale low-cost nanophotonic solar absorbers have been developed based on nickel nanopyramid structures. The fabrication process mainly exploits cost-effective materials and technologies such as template stripping and electroplating. The measured absorptivity/emissivity demonstrates excellent spectrum selection with ~95% solar absorptivity and ~10% emissivity in the infrared range. Due to the 3D design, the excellent selective absorption maintains for the incident angles in the range of ±50°, which indicates the omnidirectional absorption of the solar absorbers. The thermal annealing tests indicate that the nickel nanophotonic absorbers are stable at 800° C. The combined spectrum selection, high temperature stability, and omnidirectional absorption demonstrated in our work are unprecedented compared to existing solar absorber structures/materials. Other than solar-to-electricity energy conversion, the high-performance solar selective absorbers can be equally applied to other solar thermal systems, such as solar water heaters and solar fuel production.

The following clauses outline various illustrative aspects of the invention:

1. A solar device, comprising, a metallic substrate comprising a plurality of protuberances each having a base having an edge or a diameter, and an apex, and tapering from the base to the apex, wherein the distance between the base of adjacent protuberances is less than 200 nm, and the diameter and/or length of a side of the base ranges from 100 nm to 1000 nm.

2. The device of clause 1, further comprising an antireflective coating having a refractive index greater than one and less than the maximum refractive index of the metallic substrate at the base of the protuberances.

3. The device of clause 1, wherein the base of the protuberance is a square or rectangle.

4. The device of clause 2, wherein the antireflective coating comprises a metal oxide or a silicon nitride.

5. The device of clause 4, wherein the antireflective coating has a thickness of from 50 nm to 1 μm in thickness.

6. The device of any one of clauses 1 to 5, wherein the metallic substrate comprises nickel, copper, gold, silver or an alloy thereof, e.g., an alloy with tungsten, such as a nickel-tungsten alloy.

7. The device of clause 2, wherein the antireflective coating comprises an aluminum oxide.

8. The device of any one of clauses 1 to 7, wherein the protuberances are pyramidal, conical, frusto-pyramidal, or frusto-conical.

9. The device of clause 8, wherein the protuberances are pyramidal, having a square or rectangular base wherein a plane containing a side of the protuberance is at an angle of 54.7 degrees from the plane of the major surface of the contiguous portion of the metallic substrate from which the protuberance extends.

10. The device of any one of clauses 1 to 9, wherein the distance between the base of adjacent protuberances is less than 50 nm.

11. The device of any one of clauses 1 to 10, wherein the protuberances are uniformly-spaced on the substrate.

12. The device of clause 2, wherein the antireflective coating comprises an oxide of aluminum, hafnium, titanium, and/or zirconium.

13. A template for producing a solar device, comprising a substrate having a major surface comprising a plurality of indentations, each of the plurality of indentations having an opening at the major surface (that is, coplanar with the major surface), wherein the openings are spaced less than 200 nm apart, and the opening of each of the plurality of indentations having a side length or a diameter ranging from 100 nm to 1000 nm.

14. The template of clause 13, wherein the template is a silicon substrate having a major surface comprising a silica coating, and the indentations are pyramidal indentations with a square or rectangular opening at the major surface.

15. The template of clause 13, wherein the openings are regularly-spaced.

16. A method of making a solar thermal absorbing device, comprising,
  a. depositing a metal layer onto a template, comprising a substrate having a major surface comprising a plurality of indentations, each of the plurality of indentations having an opening at the major surface (that is, coplanar with the major surface), wherein the openings are spaced less than 200 nm apart, and the opening of each of the plurality of indentations having a side length or a diameter ranging from 100 nm to 1000 nm, wherein the metal is deposited in an amount to fill in the indentations of the template and to produce a contiguous metal layer, optionally having a thickness of from 1 μM to 100 μM over at least a portion of the major surface of the template comprising the indentations; and
  b. releasing (e.g., peeling or delaminating) the deposited metal layer from the template to produce a metallic substrate having a major surface, comprising a plurality of protuberances on the major surface, each of the plurality of protuberance having a base having an edge or a diameter, and an apex, and tapering from the base to the apex, wherein the distance between the base of adjacent protuberances is less than 200 nm, and the diameter or an edge of the base ranges from 100 nm to 1000 nm.

17. The method of clause 16, wherein the template is a silicon substrate having a major surface comprising a silica coating, and the indentations are pyramidal indentations with a square or rectangular opening at the major surface.

18. The method of clause 16 or clause 17, further comprising depositing an antireflective coating over at least a portion of the metallic substrate including the plurality of protuberances.

19. The method of clause 18, wherein the antireflective coating comprises a metal oxide or a silicon nitride.

20. The method of clause 18, wherein the antireflective coating has a thickness of from 50 nm to 1 µm.

21. The method of clause 18, wherein the antireflective coating comprises an oxide of aluminum, hafnium, titanium, and/or zirconium.

22. The method of clause 18, wherein the antireflective coating comprises an aluminum oxide.

23. The method of any one of clauses 16-22, wherein the metallic substrate is nickel, copper, silver, gold, or an alloy thereof, e.g., an alloy with tungsten, such as a nickel-tungsten alloy.

24. The method of any one of clauses 16-23, wherein the protuberances are pyramidal, conical, frusto-pyramidal, or frusto-conical.

25. The method of clause 24, wherein the protuberances are pyramidal, having a square or rectangular base and wherein a plane containing a side of the protuberance is at an angle of 54.7 degrees from the plane of the major surface of the contiguous portion of the metallic substrate from which the protuberance extends.

26. The method of any one of clauses 16 to 25, wherein the distance between the base of adjacent protuberances is less than 50 nm.

27. The method of any one of clauses 16-26, wherein the protuberances are uniformly-spaced on the substrate.

28. The method of clause 24, wherein the protuberances are frusto-conical or frusto-pyramidal.

Having described this invention, it will be understood to those of ordinary skill in the art that the same can be performed within a wide and equivalent range of conditions, formulations and other parameters without affecting the scope of the invention or any embodiment thereof.

We claim:

1. A method of making a solar thermal absorbing device, the method comprising:
    forming a template by interference lithography and etching, the template comprising a substrate having a major surface comprising a plurality of indentations, each of the plurality of indentations having an opening at the major surface, wherein the openings are spaced less than 200 nm apart, and the opening of each of the plurality of indentations having a side length or a diameter ranging from 100 nm to 1000 nm;
    depositing a metal layer onto the template, wherein the metal is deposited in an amount to fill in the indentations of the template and to produce a contiguous metal layer having a thickness of from 1 µM to 100 µM over at least a portion of the major surface of the template comprising the indentations;
    releasing the deposited metal layer from the template to produce a metallic substrate having a major surface, comprising a plurality of protuberances on the major surface, each of the plurality of protuberance having a base having an edge or a diameter, and an apex, and tapering from the base to the apex, wherein the distance between the base of adjacent protuberances is less than 200 nm, and the diameter or an edge of the base ranges from 100 nm to 1000 nm; and
    depositing an antireflective coating over at least a portion of the metallic substrate including the plurality of protuberances to form the solar thermal absorbing device.

2. The method of claim 1, wherein the template is a silicon substrate having a major surface comprising a silica coating, and the indentations are pyramidal indentations with a square or rectangular opening at the major surface.

3. The method of claim 1, wherein the antireflective coating comprises a metal oxide or a silicon nitride.

4. The method of claim 1, wherein the antireflective coating has a thickness of from 50 nm to 1 µm.

5. The method of claim 1, wherein the antireflective coating comprises an oxide of aluminum, hafnium, titanium, or zirconium.

6. The method of claim 1, wherein the antireflective coating comprises an aluminum oxide.

7. The method of claim 1, wherein the metallic substrate is nickel, copper, silver, gold, or an alloy thereof.

8. The method of claim 1, wherein the protuberances are pyramidal, conical, frusto-pyramidal, or frusto-conical.

9. The method of claim 8, wherein the protuberances are pyramidal, having a square or rectangular base and wherein a plane containing a side of the protuberance is at an angle of 54.7 degrees from the plane of the major surface of the contiguous portion of the metallic substrate from which the protuberance extends.

10. The method of claim 8, wherein the protuberances are frusto-conical or frusto-pyramidal.

11. The method of claim 1, wherein the distance between the base of adjacent protuberances is less than 50 nm.

12. The method of claim 1, wherein the protuberances are uniformly-spaced on the substrate.

13. The method of claim 1, wherein the antireflective coating has a thickness of from 65 nm to 80 nm.

* * * * *